(12) United States Patent
Sato et al.

(10) Patent No.: US 6,248,180 B1
(45) Date of Patent: Jun. 19, 2001

(54) METHOD FOR REMOVING PARTICLES FROM A SEMICONDUCTOR WAFER

(75) Inventors: Nobuyoshi Sato; Hideaki Seto; Koji Ohsawa; Haruhiko Yamamoto, all of Tsukuba (JP)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/150,220

(22) Filed: Sep. 9, 1998

(30) Foreign Application Priority Data

Sep. 17, 1997 (JP) .................................................. 9-251840

(51) Int. Cl.[7] ...................................................... B08B 1/00
(52) U.S. Cl. ................... 134/6; 134/1; 134/1.3; 134/2; 134/25.4; 134/25.5; 134/26; 134/32; 134/33; 134/34; 134/42; 134/902; 15/21.1; 15/77; 15/88.2; 15/88.3; 15/97.1; 15/102
(58) Field of Search ............................. 15/21.1, 77, 88.2, 15/88.3, 97.1, 102; 134/1, 1.3, 2, 6, 25.4, 25.5, 26, 32, 33, 34, 42, 902

(56) References Cited

U.S. PATENT DOCUMENTS

| | | | |
|---|---|---|---|
| 4,475,259 | * | 10/1984 | Ishii et al. ................................ 15/102 |
| 5,375,291 | * | 12/1994 | Tateyama et al. ...................... 15/302 |
| 5,624,501 | * | 4/1997 | Gill, Jr. ..................................... 134/6 |
| 5,755,614 | * | 5/1998 | Adams et al. ......................... 134/902 |
| 5,861,066 | * | 1/1999 | Moinpour et al. ..................... 15/97.1 |
| 5,890,251 | * | 4/1999 | Terui ...................................... 15/88.2 |
| 5,893,381 | * | 4/1999 | Terui ........................................ 15/77 |
| 5,911,232 | * | 6/1999 | Mokuo et al. ........................ 134/184 |
| 5,966,765 | * | 10/1999 | Hamada et al. .......................... 15/77 |
| 5,976,267 | * | 11/1999 | Culkins et al. ........................... 15/77 |

FOREIGN PATENT DOCUMENTS 8-31780   7/1994   (JP) .

* cited by examiner

*Primary Examiner*—Sharidan Carrillo

(57) ABSTRACT

A method of removing particles adhering to a surface of a semiconductor wafer including the steps of: providing a container having a drain valve; positioning the semiconductor wafer in the container; directing a jet stream consisting of water against the surface of the semiconductor wafer; removing particles adhering to the surface of the semiconductor wafer by scrubbing the surface of the semiconductor wafer with a brush while the jet stream of water is directed against the surface of the semiconductor wafer; closing the drain valve while the jet stream of water is directed against the semiconductor wafer, wherein the water accumulates in the container to thereby completely immerse the brush and the semiconductor wafer in the water in the container; and maintaining the brush and the semiconductor wafer completely immersed in the water from the jet stream for a predetermined period of time.

14 Claims, 3 Drawing Sheets

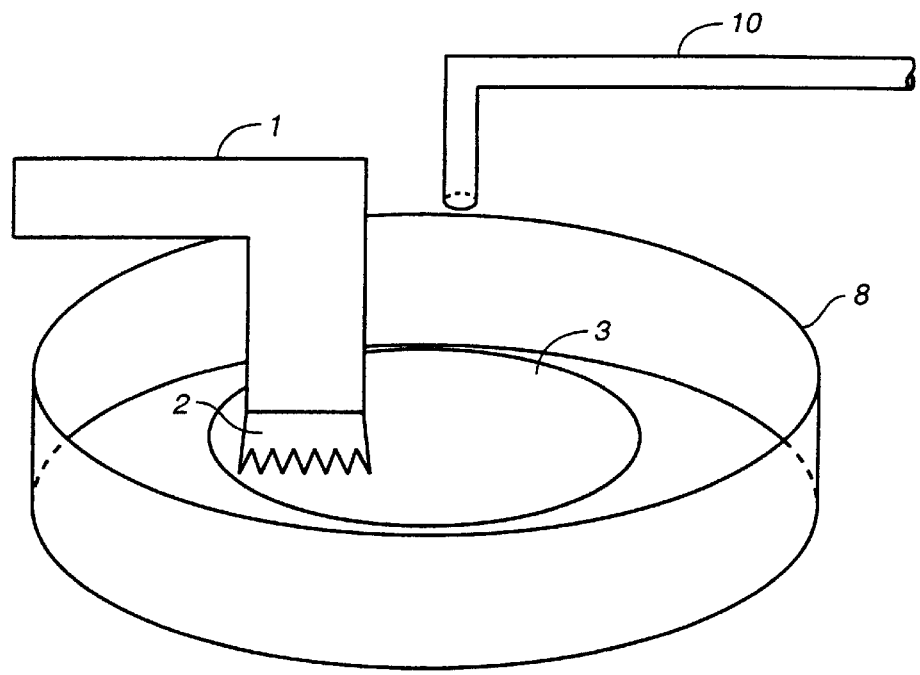
FIG._1 *(Prior Art)*
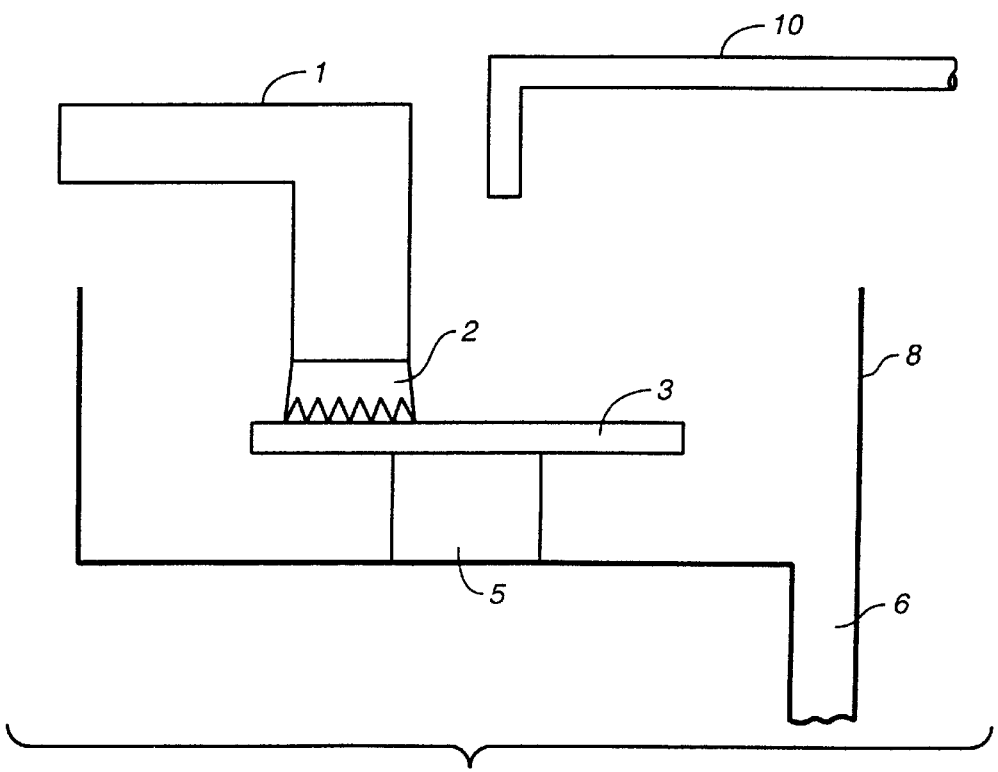
FIG._2 *(Prior Art)*

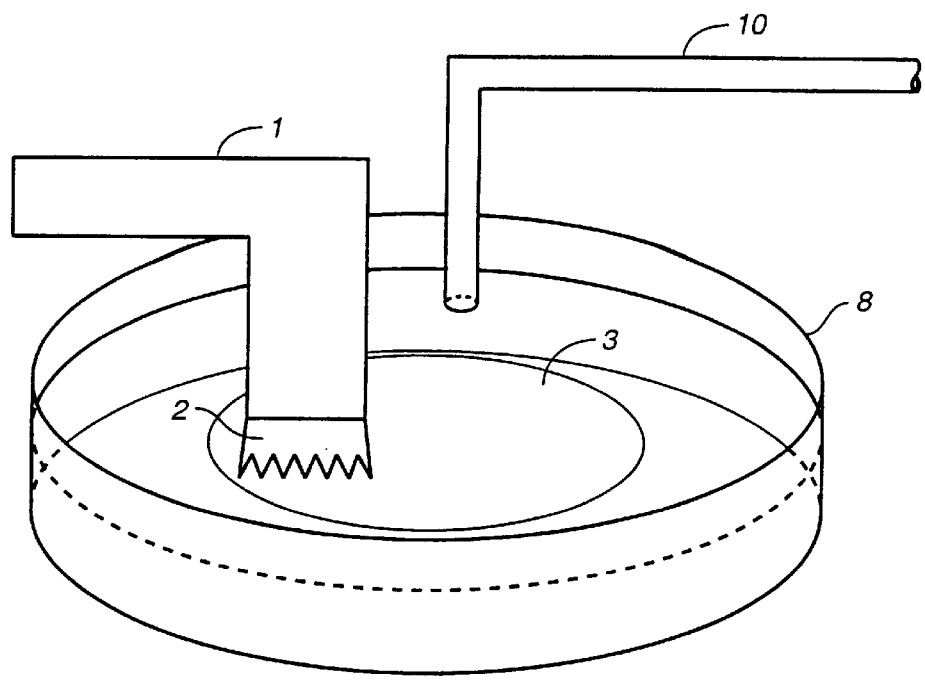
FIG._3
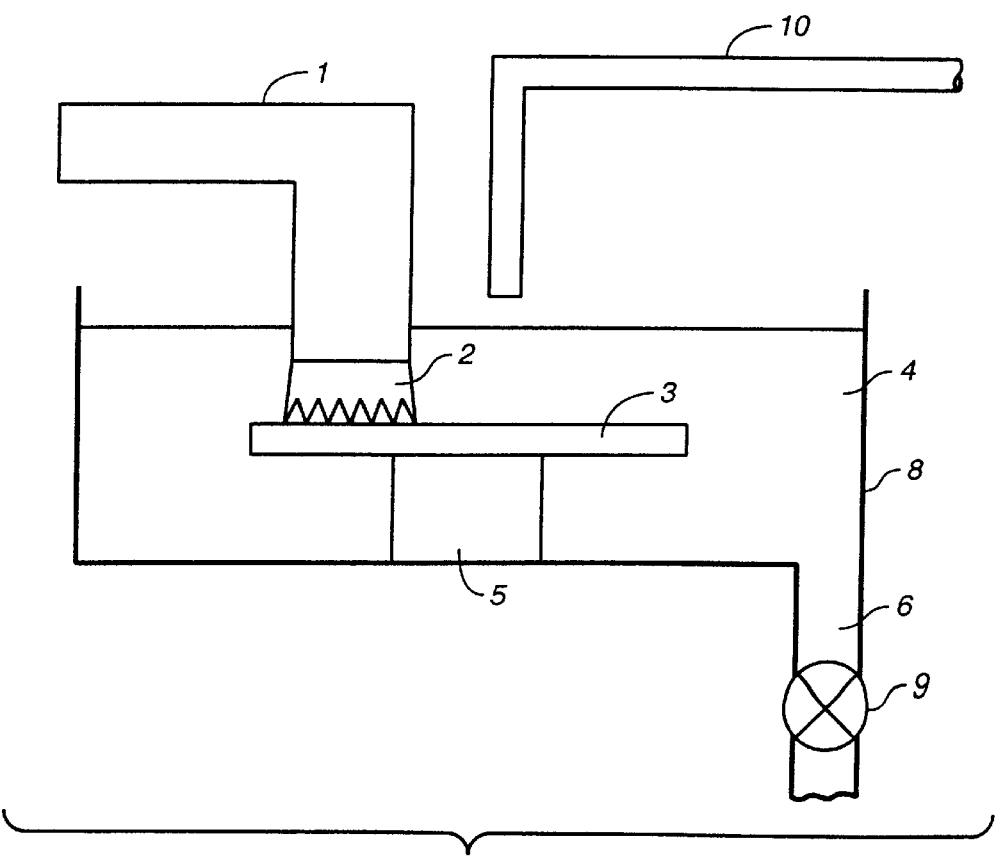
FIG._4

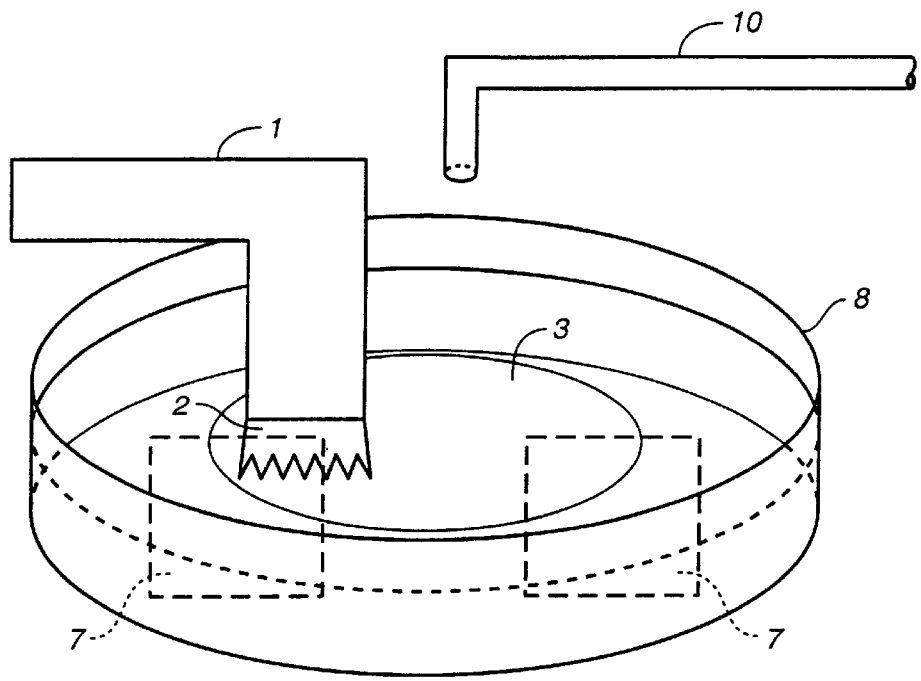
FIG._5
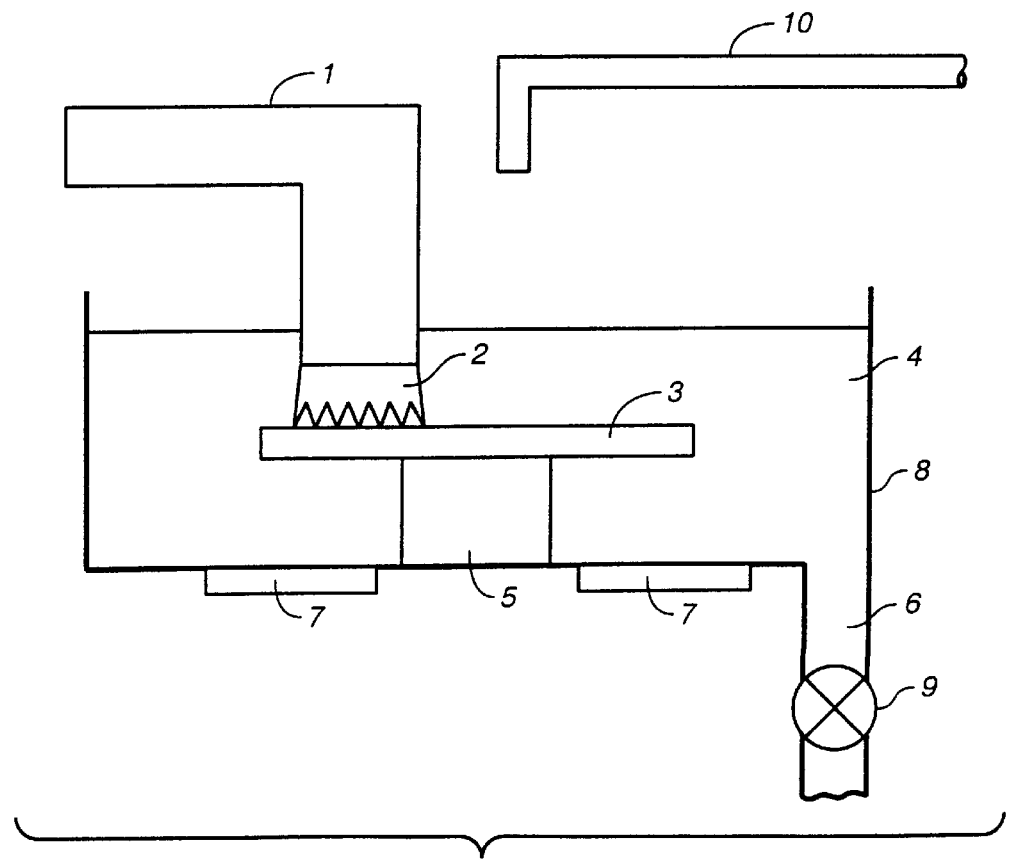
FIG._6

METHOD FOR REMOVING PARTICLES FROM A SEMICONDUCTOR WAFER

BACKGROUND OF THE INVENTION

1. Field of the Invention

The present invention pertains to a method and apparatus for removing particles adhering to a semiconductor wafer. More specifically, the present invention comprises an improved method and apparatus for removing particles on a semiconductor wafer employing a combination of brush scrubbing processing and jet water cleaning, while immersing both the brush and the wafer in water; as well as optional application of ultrasonic waves to the water during the cleaning.

2. Description of the Related Art

With the higher density and finer geometry of integrated circuits to be formed on a semiconductor wafer, even particles as small as about 0.3 µm have a considerable effect on the yield of products. Because of this, the semiconductor industry has been placing more and more importance on techniques for removing particles from the surface of a semiconductor wafer. Needless to say, it is vital to develop an improved technique which is simple and is still able to remove particles as efficiently as possible while keeping the cleaning time short.

As an example of conventional particle removing techniques, the invention disclosed in Japanese Patent Laid Open Application No. 31780/96 can be cited. The method described therein comprises the removal of particles by directing, from one direction, a jet stream of pure water against the surface of a rotating semiconductor substrate while pressing a rotating brush against the surface of the substrate and moving the brush in a predetermined manner.

FIGS. 1 and 2, respectively, are a perspective and a front view of a prior art particle removing apparatus. A typical prior art procedure for removing particles using the prior art apparatus of FIGS. 1 and 2 is as follows.

First, wafer 3, on which a resist etch back processing has been performed, is mounted on wafer support 5. Wafer 3 is made to rotate while jet stream discharge pipe 10 directs a first jet stream consisting of pure water against wafer 3. Next, brush 2 is brought into contact with the surface of the wafer, where brush 2 rotates to move from side to side. After a predetermined period of time, brush 2 is moved out of contact with wafer 3 and the surface of wafer 3 is rinsed with another jet stream (second jet stream) consisting of pure water to thereby discharge pure water 4 containing particles.

Table 1 below indicates the results of an experiment conducted by the present inventors, which shows the numbers of particles (not smaller than 0.3 µm) on wafer 3 before the above-described prior art processing and after performing the prior art processing for various predetermined different time periods.

TABLE 1

| Particles on Wafer Before Processing | Particles on Wafer After Processing | Processing Time |
| --- | --- | --- |
| 300 | 101 | 1 minute of first jet stream + 1 minute of scrubbing + 1 minute of second jet stream |
| 312 | 89 | 1 minute of first jet stream + 2 minutes of scrubbing + 1 minute of second jet stream |

TABLE 1-continued

| Particles on Wafer Before Processing | Particles on Wafer After Processing | Processing Time |
| --- | --- | --- |
| 305 | 72 | 1 minute of first jet stream + 2 minutes of scrubbing + 2 minutes of second jet stream |

As is clear from the results shown in Table 1, while the number of particles before the above described prior art processing is not less than 300, the number of particles after the prior art processing is still as high as 100.

SUMMARY OF THE INVENTION

It is the object of the present invention to provide a method and apparatus and process for improving the removal of particles from the surface of a semiconductor substrate. The method of removing particles of the present invention comprises removing particles adhering to the surface of a semiconductor wafer by scrubbing the surface with a brush and directing a jet stream consisting of pure water against the wafer surface, while the brush and semiconductor wafer are wholly immersed in pure water discharged from the jet stream. The wafer and the brush are immersed in the water by shutting a drain valve of a container surrounding the wafer whereby the pure water discharged from the jet stream accumulates in the container to thereby immerse the wafer and the brush in the water in the container.

In another embodiment, by further applying ultrasonic waves to the pure water in which the brush and semiconductor wafer are completely immersed, the particles can be even more thoroughly removed with the help of vibrations caused by the ultrasonic waves propagated in the pure water.

BRIEF DESCRIPTION OF THE DRAWINGS

FIG. 1 is a perspective view of a particle removing apparatus according to a prior art.

FIG. 2 is a front view of the particle removing apparatus according to the prior art.

FIG. 3 is a perspective view of a particle removing apparatus according to one embodiment of the present invention.

FIG. 4 is a front view of the particle removing apparatus of FIG. 3 of the present invention.

FIG. 5 is a perspective of the particle removing apparatus according to another embodiment of the present invention, wherein ultrasonic waves are being applied.

FIG. 6 is a front view of the particle removing apparatus of FIG. 5 of the present invention.

DETAILED DESCRIPTION OF THE INVENTION

FIGS. 3–6 describe several embodiments of the particle removing apparatus of the present invention. The perspective view of FIG. 3 and the front view of FIG. 4 illustrate the apparatus and method of the invention wherein ultrasonic waves are not being applied to the wafer. In FIGS. 3 and 4 of the drawings, the reference numeral 1 denotes a brush arm; 2 is a brush; 3 is a wafer; 4 is pure water; 5 is a wafer stage; 6 is a drain; 8 is a container; 9 is a drain valve; and 10 is a jet stream discharge pipe.

The problems solved by the invention may be described as follows: When a jet stream of water is discharged from only one direction, the direction of force is limited and therefore adhering particles cannot be thoroughly removed. Further, when the cleaning method employs a brush, particles removed from the surface of a wafer may continue to stay on the brush, accumulating between the bristles of the brush. Such accumulated particles can then return and adhere to the wafer. The aforementioned re-adhesion problem tends to arise in particular when a wafer with a relatively few particles thereon is contacted and processed with a brush after that brush has been previously used to process a wafer with a great number of particles thereon.

Considering that the prior art's problem is re-adhesion, to the wafer, of particles which have accumulated between bristles of the brush use to clean the wafer, in the present invention, a drain valve is held shut while the jet stream of pure water is being discharged against the wafer so that pure water is collected in a container surrounding the wafer until the brush and the semiconductor wafer are completely immersed in the pure water. Thus, particles re-adhering to the wafer are also removed. Further in accordance with another embodiment of the present invention, ultrasonic waves are applied to the pure water by ultrasonic vibrators.

Turning now to the drawings, first, a drain valve 9 is shut and wafer 3, on which, for example, a resist etch back processing has been performed, is disposed on wafer stage 5.

While rotating wafer 3, a first jet stream consisting of pure water is directed against wafer 3 from jet stream discharge pipe 10 for at least about 1 minute. Then, brush 2 is brought into contact with the surface of wafer 3 for at least about 1 minute, preferably about 2 minutes so that brush 2 rotates itself to move from side to side on the surface of wafer 3. During this time, a container 8, which surrounds wafer 3 and is connected to drain valve 9 through drain 6, fills up with the pure water from the jet stream, thereby totally immersing both wafer 3 and brush 2 in the water in container 8.

After a predetermined period of time, brush 2 is moved out of contact with wafer 3 and the drain valve 9 is opened. The surface of wafer 3 is then rinsed for at least about 1 minute, preferably about 2 minutes with another jet stream (second jet stream) consisting of pure water, thereby discharging, through drain 6 and drain valve 9, 1 pure water 4 containing particles.

To illustrate the practice of the invention, the results of an experiment conducted by the present inventor are shown in Table 2, which shows the numbers of particles (not smaller than 0.3 $\mu$m) on the wafer 3 before the above-described processing of the invention, and after performing the processing of the invention for predetermined different lengths of time.

TABLE 2

| Particles on Wafer Before Processing | Particles on Wafer After Processing | Processing Time |
| --- | --- | --- |
| 300 | 12 | 1 minute of first jet stream + 1 minute of scrubbing + 1 minute of second jet stream |
| 312 | 8 | 1 minute of first jet stream + 2 minutes of scrubbing + 1 minute of second jet stream |
| 305 | 3 | 1 minute of first jet stream + 2 minutes of scrubbing + 2 minutes of second jet stream |

The results shown in Table 2 indicate that while the number of particles before the above described processing of the invention is not less than 300, the number of particles remaining on the wafer after the processing of the invention is as 12 or less.

Turning now to FIGS. 5 and 6, another embodiment of the invention is illustrated which additionally includes a procedure for applying ultrasonic waves, as will be explained below. FIGS. 5 and 6 are respectively a perspective and a front view of the apparatus of the invention wherein ultrasonic waves are applied. The reference numerals 1–6 and 8–10 denote the same components in FIGS. 3, 4, 5 and 6. However, the reference numeral 7 in FIGS. 5 and 6 denotes an ultrasonic vibrator (5 MHz, 5 kw).

The procedure to be followed when using the apparatus of FIGS. 5 and 6 is as follows. First, drain valve 9 is shut and wafer 3, on which, for example, a resist etch back processing has been performed, is mounted on wafer support 5. Then, while rotating wafer 3, a first jet stream consisting of pure water is directed against wafer 3 from jet stream discharge pipe 10. Next, brush 2 is brought into contact with the surface of the wafer so that brush 2 rotates to move from side to side on wafer 3, while the pure water from the jet stream accumulates in container 8, thereby totally immersing both wafer 3 and brush 2 in the water.

At this time, in accordance with this embodiment of the invention, ultrasonic waves are applied, via ultrasonic vibrators 7 in the water in container 8, to the pure water 4 accumulating in container 8, so that fine particles are separated from semiconductor wafer 3 by the vibration in the pure water in container 8 caused by the ultrasonic waves. After a predetermined period of time, brush 2 is detached from wafer 3, and drain valve 9 is opened. The surface of wafer 3 is rinsed with a jet stream (second jet stream) consisting of pure water, thereby discharging pure water 4 containing particles.

To illustrate the practice of this second embodiment of the invention in which ultrasonic waves are also utilized in the cleaning process, the results of a further experiment conducted by the inventors are indicated in Table 3, which shows the numbers of particles (not smaller than 0.3 $\mu$m) on the wafer 3 before the above-described processing of the invention, and after performing the processing of the invention for predetermined different lengths of time.

TABLE 3

| Particles on Wafer Before Processing | Particles on Wafer After Processing | Processing Time |
| --- | --- | --- |
| 318 | 1 | 1 minute of first jet stream + 1 minute of scrubbing + 1 minute of second jet stream |
| 321 | 0 | 1 minute of first jet stream + 2 minutes of scrubbing + 1 minute of second jet stream |
| 343 | 0 | 1 minute of first jet stream + 2 minutes of scrubbing + 2 minutes of second jet stream |

The results shown in Table 3 indicate that while the number of particles before the above described processing of the invention is not less than 300, the number of particles remaining on the wafer after the processing of the invention, including the utilization of ultrasonic waves, is either 1 or 0.

The method of removing particles in accordance with the present invention, includes holding a drain valve shut while a jet stream is being discharged, whereby pure water is collected in a container surrounding the wafer and the brush, until both the wafer and the brush are completely immersed in the pure water. Thereby, particles trapped between bristles of the brush, for example, when a wafer with a great number of particles was previously processed, can be also removed and thus, re-adhesion of particles to a wafer is prevented.

Still further, according to a preferred embodiment of the method of the invention, ultrasonic waves are also applied, via ultrasonic vibrators, to the water collecting in the container. Thereby, particles on the surface of a wafer can be uniformly removed with the help of vibration of pure water caused by applied ultrasonic waves, unlike the prior art which employs only a jet stream wherein particles on the surface of a wafer are unevenly removed.

The aforementioned Japanese Patent Laid Open Application No. 31780/96 indicates that for purposes of evenly removing particles adhering to the surface of a semiconductor wafer, a brush scrubber is made to move spirally, or the temperature of the cleaning water is increased, or multiple openings are provided through which a jet stream is discharged. On the contrary, according to the present invention, a drain valve, connected to a drain from a container surrounding the wafer and the brush, is shut to completely immerse the brush and the semiconductor wafer in pure water accumulating in the container, whereby particles trapped between bristles of the brush, which may eventually re-adhere to a semiconductor wafer, are removed. Thus, the present invention has a very simple and yet effective constitution. Secondly, the present invention comprises a novel method wherein ultrasonic waves are applied to pure water in which a brush and a semiconductor wafer are completely immersed, whereby particles are mechanically removed not only in a macroscopic manner by the brush and jet stream but also in a microscopic manner by small vibrations of ultrasonic waves in pure water. Therefore, the method and apparatus of the present invention can provide considerably improved results compared to the prior art method and apparatus for removing particles.

Having thus described the invention what is claimed is:

1. A method of removing particles adhering to a surface of a semiconductor wafer comprising the sequential steps of:
   a) providing a container having a drain valve;
   b) positioning said semiconductor wafer in said container;
   c) initially directing a first jet stream consisting of water against said surface of said semiconductor wafer;
   d) then, after said initially directing said first jet stream against said surface of said semiconductor wafer commences, removing particles adhering to said surface of said semiconductor wafer by scrubbing said surface of said semiconductor wafer with a brush while said first jet stream of water continues to be directed against said surface of said semiconductor wafer;
   e) closing said drain valve while said first jet stream of water is directed against said semiconductor wafer, wherein said water accumulates in said container to thereby completely immerse said brush and said semiconductor wafer in said water in said container;
   f) maintaining said brush and said semiconductor wafer completely immersed in said water from said first jet stream for a predetermined period of time;
   g) then moving said brush out of contact with said surface of said semiconductor wafer; and
   h) then rinsing said surface of said semiconductor wafer.

2. The method of claim 1 wherein said step of initially directing said first jet stream of water against said surface of said semiconductor wafer further comprises rotating said wafer.

3. The method of claim 1 wherein said step of rinsing said surface of said semiconductor wafer further comprises directing a second jet stream of water against said surface of said semiconductor wafer.

4. The method of claim 1 wherein said step of initially directing said first jet stream of water against said surface of said semiconductor wafer is carried out for a period of at least about 1 minute.

5. The method of claim 1 wherein said step of scrubbing said surface of said semiconductor wafer with said brush is carried out for a period of at least 1 minute.

6. The method of claim 1 which further comprises, after commencement of step e), the step of applying ultrasound waves to said water in which said brush and said semiconductor wafer are immersed in said container.

7. The method of claim 5 wherein said step of scrubbing said surface of said semiconductor wafer with said brush is carried out for a period of about 2 minutes.

8. The method of claim 3 wherein said step of rinsing said surface of said semiconductor by directing said second jet stream of water against said surface of said semiconductor wafer further comprises directing said second jet stream of water against said surface of said semiconductor wafer for a period of at least about 1 minute.

9. The method of claim 6 wherein said ultrasonic waves are applied to said water in said container via ultrasonic vibrators in said water.

10. The method of claim 8 wherein said step of directing said second jet stream of water against said surface of said semiconductor wafer is carried out for a period of about 2 minutes.

11. A method of removing particles adhering to a surface of a semiconductor wafer, using a brush and a jet stream of water comprising the steps of:
    a) providing a container with a drain valve;
    b) positioning said semiconductor wafer within said container;
    c) closing said drain valve;
    d) directing said jet stream of water against said surface of said semiconductor wafer;
    e) removing said particles adhering to said surface of said semiconductor wafer by scrubbing said surface of said semiconductor wafer with said brush for a predetermined period of time while said jet stream of water is directed against said semiconductor wafer, wherein said water accumulates in said container to thereby completely immerse said brush and said semiconductor wafer in said water in said container; and
    f) rinsing said surface of said semiconductor wafer.

12. The method of claim 11 which further comprises, after commencement of step e), the step of applying ultrasound waves to said water in which said brush and said semiconductor wafer are immersed in said container.

13. A method of removing particles adhering to a surface of a semiconductor wafer, using a brush and a jet stream of water comprising the steps of:
    a) providing a container having a drain valve;
    b) positioning said semiconductor wafer within said container;
    c) closing said drain valve;
    d) directing said jet stream of water against said surface of said semiconductor wafer;
    e) removing particles from said semiconductor wafer by scrubbing said surface of said semiconductor wafer with said brush for a predetermined period of time while said jet stream of water is directed against said semiconductor wafer, wherein said water accumulates in said container to thereby completely immerse said brush and said semiconductor wafer in said water in said container;

f) applying ultrasound waves to said water in which said brush and said semiconductor wafer are immersed in said container to further remove remaining particles from said surface of said semiconductor wafer; and g) rinsing said surface of said semiconductor wafer.

14. A method of removing particles adhering to a surface of a semiconductor wafer comprising the steps of:

a) providing a container having a drain valve;

b) positioning said semiconductor wafer in said container;

c) directing a jet stream consisting of water against said surface of said semiconductor wafer;

d) removing particles adhering to said surface of said semiconductor wafer by scrubbing said surface of said semiconductor wafer with a brush while said jet stream of water is directed against said surface of said semiconductor wafer;

e) closing said drain valve while said jet stream of water is directed against said semiconductor wafer, wherein said water accumulates in said container to thereby completely immerse said brush and said semiconductor wafer in said water in said container; and f) maintaining said brush and said semiconductor wafer completely immersed in said water from said jet stream for a predetermined period of time.

* * * * *